(12) United States Patent
Hool

(10) Patent No.: US 9,368,440 B1
(45) Date of Patent: Jun. 14, 2016

(54) EMBEDDED COAXIAL WIRE AND METHOD OF MANUFACTURE

(71) Applicant: Altera Corporation, San Jose, CA (US)

(72) Inventor: Vincent Hool, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/956,176

(22) Filed: Jul. 31, 2013

(51) Int. Cl.
*H01L 23/498* (2006.01)
*H01L 23/48* (2006.01)
*H01L 23/538* (2006.01)

(52) U.S. Cl.
CPC ........ *H01L 23/49827* (2013.01); *H01L 23/481* (2013.01); *H01L 23/5384* (2013.01); *H01L 2223/6622* (2013.01)

(58) Field of Classification Search
CPC ................. H01L 23/49827; H01L 23/235384; H01L 2223/6622
See application file for complete search history.

(56) References Cited

U.S. PATENT DOCUMENTS

| | | | | |
|---|---|---|---|---|
| 4,603,023 A | * | 7/1986 | Mack | G01R 1/06783 264/135 |
| 5,764,485 A | * | 6/1998 | Lebaschi | H01L 24/75 174/255 |
| 5,814,889 A | * | 9/1998 | Gaul | H01L 21/763 257/750 |
| 6,498,299 B2 | | 12/2002 | Sekizuka | |
| 7,033,934 B2 | * | 4/2006 | Iijima et al. | 438/667 |
| 8,419,464 B2 | | 4/2013 | Montena et al. | |
| 9,070,674 B2 | * | 6/2015 | Gallegos | H01L 23/49811 |
| 2005/0009415 A1 | * | 1/2005 | Johnson | H01R 12/523 439/865 |
| 2005/0184377 A1 | * | 8/2005 | Takeuchi et al. | 257/686 |
| 2011/0296678 A1 | * | 12/2011 | Russell | 29/829 |
| 2013/0008603 A1 | | 1/2013 | Eto et al. | |

FOREIGN PATENT DOCUMENTS

| | | |
|---|---|---|
| EP | 0183598 | 1/1987 |
| JP | 05167258 A * | 7/1993 |

* cited by examiner

*Primary Examiner* — Matthew Reames
*Assistant Examiner* — Vincent Wall

(57) ABSTRACT

A method of manufacturing an integrated circuit package substrate is disclosed. The method may include forming a hole through a substrate layer in the package substrate. The method also includes inserting a prefabricated coaxial wire segment into the hole. The prefabricated coaxial wire segment may include a signal conductor, a ground conductor that surrounds the signal conductor, and dielectric material interposed between the signal conductor and the ground conductor. Furthermore, an integrated circuit package is also disclosed.

19 Claims, 8 Drawing Sheets

EMBEDDED COAXIAL WIRE AND METHOD OF MANUFACTURE

BACKGROUND

An integrated circuit package typically includes an integrated circuit (IC) mounted on a package substrate. The package substrate may include conductive pathways for routing signals in and out of the integrated circuit. Generally, the package substrate may be formed from a plurality of substrate layers for complex signal routings. Plated through-hole (PTH) vias may be utilized for transmitting signals from one substrate layer to another substrate layer.

Signals that are transmitted through PTH vias are generally susceptible to signal crosstalk interference. Signal crosstalk interference occurs when one signal interferes with another signal. Signal crosstalk interference often occurs when two signal conductors that are transmitting signals are close to each other. Hence, in most package substrates, the distance or "pitch" between two consecutive signal transmitting PTH vias is relatively large. Signal crosstalk interference may be further reduced by surrounding the signal transmitting PTH vias with ground PTH vias (i.e., PTH vias that are coupled to ground).

There are, however, a few drawbacks to having ground PTH vias surrounding a signal transmitting PTH via. One of the drawbacks is the large space requirement on a substrate layer due to the number of ground PTH vias needed. Consequently, the density or the number of signal transmitting PTH vias on a particular substrate layer is significantly reduced. This may lead to an increase in the number of substrate layers needed in a single package substrate. With every new generation of integrated circuit packages, the increase in package size becomes more critical.

It is within this context that the embodiments described herein arise.

SUMMARY

Embodiments described herein include an embedded coaxial wire and method of manufacture. It should be appreciated that the embodiments can be implemented in numerous ways, such as a process, an apparatus, a system, a device, or a method. Several embodiments are described below.

In one embodiment, a method of manufacturing an integrated circuit package substrate is disclosed. The method may include forming a hole through a substrate layer in the package substrate. The method also includes inserting a prefabricated coaxial wire segment into the hole.

In another embodiment, a method of manufacturing an integrated circuit package substrate may include drilling a hole from one surface of the package substrate to another surface of the package substrate. Subsequently, dielectric material is formed on an inner surface of the hole. A prefabricated coaxial wire is then placed into the hole. Finally, the prefabricated coaxial wire is adjusted to the center of the hole.

Alternatively, an integrated circuit device is disclosed. The integrated circuit device includes a package substrate coupled to the integrated circuit. The package substrate includes a prefabricated coaxial wire that is embedded within a layer of the package substrate.

The inclusion of a prefabricated coaxial wire into a package substrate may significantly reduce the need for ground plated through holes (PTHs) on a substrate layer. In addition to that, the density of signal transmitting vias may be significantly increased as the prefabricated coaxial wires may be less prone to signal crosstalk interference. Hence, the number of substrate layers in a package substrate may be reduced, which in turn reduces its manufacturing cost.

Further features of the invention, its nature and various advantages will be more apparent from the accompanying drawings and the following detailed description of the preferred embodiments.

DETAILED DESCRIPTION

The following embodiments describe an embedded coaxial wire and method to manufacture. It will be obvious, to one skilled in the art, that the present exemplary embodiments may be practiced without some or all of these specific details. In other instances, well-known operations have not been described in detail in order not to unnecessarily obscure the present embodiments.

Figure 1:
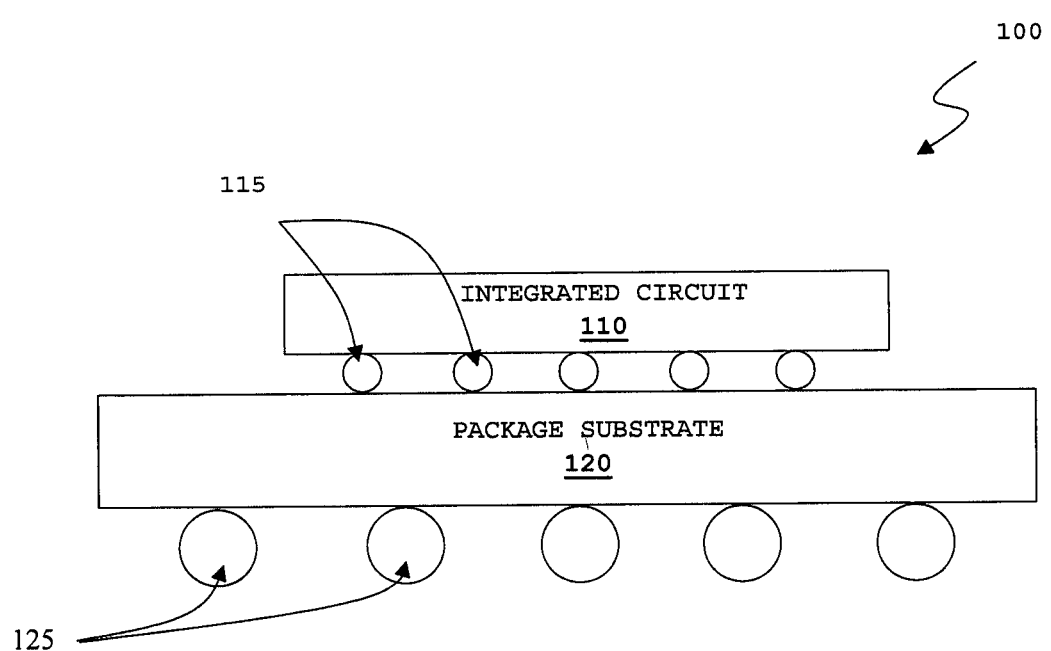
FIG. 1 shows an illustrative integrated circuit package in accordance with one embodiment of the present invention.

FIG. 1, meant to be illustrative and not limiting, shows an integrated circuit package 100 in accordance with one embodiment of the present invention. Integrated circuit package 100 may be capable of performing a fixed function (e.g., processing data or storing data) or alternatively may be programmable to perform various functions. An example of a fixed-function integrated circuit package 100 may be an application specific integrated circuit (ASIC) device or an application specific standard product (ASSP) device. Commonly available ASIC/ASSP devices may include memory devices or microprocessor devices. An example of a programmable integrated circuit package 100 may be a programmable logic device (PLD) such as a field programmable gate array (FPGA) device.

In one embodiment, integrated circuit package 100 may form a circuit in a system (e.g., a communication circuit system). Integrated circuit package 100 may perform complex tasks by communicating with various other circuits in the system. In one embodiment, other circuits in the system may include memory devices, microprocessor devices, etc. Generally, the system, together with integrated circuit package 100, may be mounted on a printed circuit board (PCB). Signal traces on the PCB enable signal routing between circuits in the system.

It should be appreciated that an integrated circuit package such as integrated circuit package 100 may also be known as a ball grid array (BGA) device, a chip scale package (CSP) device or a flip chip (FC) device depending on the manner of which integrated circuit 110 is coupled to package substrate 120. In the example of FIG. 1, integrated circuit package 100 may be referred to as a flip-chip device.

Still referring to FIG. 1, integrated circuit package 100 includes integrated circuit 110 and package substrate 120. Generally, integrated circuit 110 may be a semiconductor die.

As shown in the embodiment of FIG. 1, integrated circuit 110 may be placed on a top surface of package substrate 120.

Integrated circuit 110 may be coupled to package substrate 120 via interconnections 115. In one exemplary embodiment, interconnections 115 may be flip-chip bumps or C4 bumps. It should be appreciated that flip-chip bumps or C4 bumps may be formed with conductive materials. Alternatively, integrated circuit 110 may be coupled to package substrate 120 through conductive wires such as copper wires (not shown) instead of interconnections 115.

A bottom surface of package substrate 120 includes solder balls 125. Solder balls 125 may be a coupling means between integrated circuit package 100 and a PCB (not shown). In one embodiment, a portion of solder balls 125 may transfer signals (e.g., input/output (I/O) signals) whereas another portion of solder balls 125 may provide ground connections to integrated circuit package 100. Generally, solder balls 125 may be formed using an alloy material of gold (Sn) and lead (Pb). Alternatively, lead-free solder balls 125 may be formed using gold (Sn) and copper (Cu) materials. Still referring to FIG. 1, solder balls 125 may have diameter that is greater than bumps 115. In one embodiment, solder balls 125 may have a diameter of 0.75 millimeter (mm) whereas interconnections 115 may have a diameter of only 30-40 microns (μm).

Package substrate 120 may include one substrate layer or multiple substrate layers. For example, package substrate 120 with multiple substrate layers may be similar to package substrate 285 of FIG. 2I or package substrate 420 of FIG. 4. It should be appreciated that a single layer package substrate 120 may be utilized for applications with less complex signal routing.

In addition, package substrate 120 may be of different sizes, depending on various factors such as: (i) the size of integrated circuit 110 mounted on package substrate 120, (ii) the signal routing complexity within package substrate 120, and (iii) the number of solder balls 125 attached to package substrate 120. In one embodiment, the size of package substrate 120 may be 40 mm×40 mm.

As discussed earlier, several issues are present in previous attempts to eliminate signal cross talk for conductors in package substrate 120. In one embodiment of the present invention, package substrate 120 may be embedded with coaxial routing wires to help shield against cross talk while avoiding the bulkiness of conventional solutions. The coaxial routing wires may be similar to coaxial routing wire 230 of FIG. 2C, in one embodiment.

Package substrate 120 may also include plated through-hole (PTH) vias and package traces (both not shown in FIG. 1) embedded within package substrate 120. The PTH vias may be coupled to ground and may be utilized to further isolate signals being transmitted through the respective coaxial routing wires.

As shown in FIG. 1, I/O signals may be transmitted to integrated circuit 110 via solder balls 125, package substrate 120 and interconnections 115. Usually, when a package substrate without embedded coaxial routing wires is used, the quality of the I/O signals being transmitted through the package substrate may be compromised due to interference from other I/O signals. In one embodiment, package substrate 120 with embedded coaxial routing wires (e.g., coaxial routing wire 230 of FIG. 2C) may significantly reduce signal crosstalk interference.

Accordingly, multiple coaxial routing wires may be embedded in package substrate 120 to reduce signal crosstalk. Hence, there may be greater number of signal transmitting vias from one substrate layer to another substrate layer with the utilization of coaxial routing wires for I/O signal transmission compared to conventional implementation of signal transmission vias (a signal transmission via surrounded by a plurality of grounded vias).

It should be appreciated that integrated circuit package 100 may include other common structures or components (not shown in FIG. 1). For example, integrated circuit package 100 may include, among others, a lamination layer, built-in capacitors and inductors.

Figure 2A:
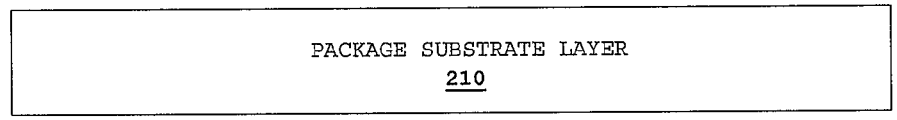
FIGS. 2A-2J show an illustrative integrated circuit package at various manufacturing stages in accordance with the present invention.

FIGS. 2A-2J, meant to be illustrative and not limiting, show an integrated circuit package at different manufacturing stages in accordance with the present invention. FIG. 2A shows an unprocessed package substrate layer 210. In one embodiment, package substrate layer 210 may be an organic substrate, or alternatively, a non-organic substrate (e.g., low temperature co-fired ceramic (LTCC) substrate or high temperature co-fired ceramic (HTCC) substrate). In one embodiment, the length and width of package substrate layer 210 may be similar to the length and width of package substrate 120.

Figure 2B:
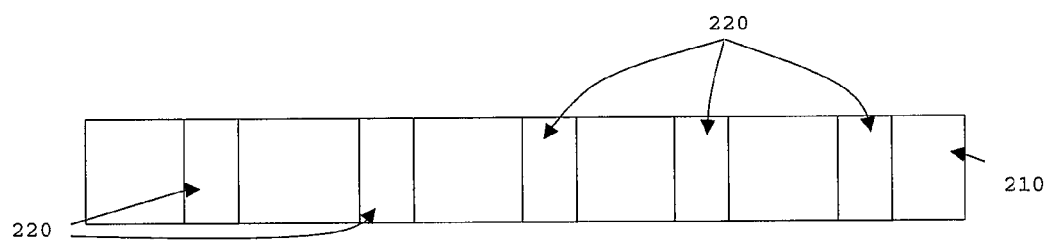

FIG. 2B shows package substrate layer 210 with a plurality of through-holes 220. Through-holes 220 may extend from a top surface of package substrate layer 210 to a bottom surface of package substrate layer 210. The pitch between through-holes 220 (i.e., distance from center of one through-hole 220 to another through-hole 220) may be 0.5 mm. The respective positions of through-holes 220 may be determined at the design stage of package substrate layer 210, after taking into account design factors such as signal routing requirements. In one embodiment, through-holes 220 may be utilized for insertion of coaxial routing wires 230 (as shown in FIG. 2D). Therefore, the diameter for each through-hole 220 may be larger than that of coaxial routing wires 230. Alternatively, through-holes 220 may also be utilized to form PTH vias (e.g., PTH vias 360 of FIG. 3).

Still referring to FIG. 2B, through-holes 220 may be of the same diameter size. However, in an alternative embodiment, through-holes 220 may have different diameter sizes. It should be appreciated that different diameter sizes may cater to coaxial routing wires 230, or PTH vias 360, with different diameter sizes.

In one embodiment, through-holes 220 may be formed using a mechanical drilling process or a laser drilling process. It should be appreciated that different drilling processes may form different types of through-holes 220. For example, the laser drilling process may be used to obtain through-holes 220 with a relatively small diameter (e.g., a diameter less than 0.15 mm). Alternatively, the mechanical drilling process may be used to obtain through-holes 220 with a larger diameter (e.g., a diameter between 0.15 to 0.3 mm or more). Other factors that may be considered for selecting a particular drilling process include: (i) a minimum pitch distance between through-holes 220 and (ii) the drilling depth of through-holes 220. Generally, for a complex package substrate layer, through-holes 220 are formed using a laser drilling process as through-holes with a smaller diameter and a smaller minimum pitch are oftentimes needed in such a package substrate layer.

Figure 2C:
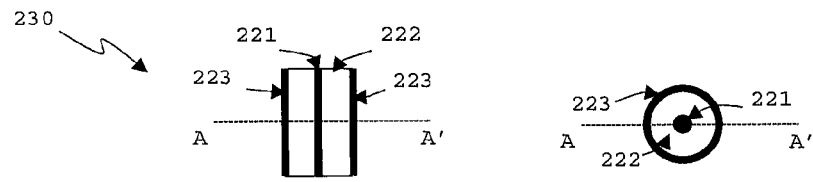
Figure 2D:
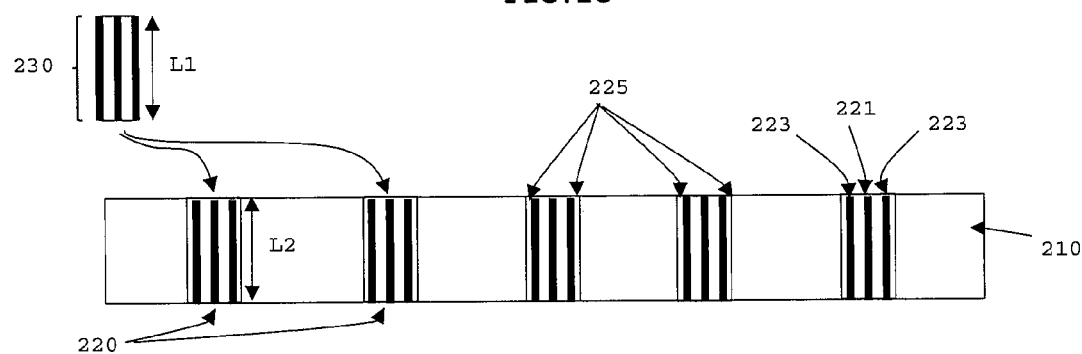

FIG. 2C shows a cross-sectional side view (on the left) and a top view (on the right) of a coaxial routing wire 230. In one embodiment, coaxial routing wire 230 may be a prefabricated coaxial wire that is sold as a discrete component. It should be appreciated that the diameter of coaxial routing wire 230 may be smaller than the diameter of holes 220 shown in FIG. 2B. In one exemplary embodiment, the diameter of coaxial routing wire 230 may be 0.2 mm.

Coaxial routing wire 230 may include conductive core 221, dielectric insulator 222 and conductive shield 223. As shown in the embodiment of FIG. 2C, dielectric insulator 222 surrounds conductive core 221 and conductive shield 223 in turn surrounds dielectric insulator 222. In an alternative embodiment, coaxial routing wire 230 may include an additional conductive shield and an additional dielectric insulator (both not shown), which may surround an outer surface of conductive shield 223. The additional conductive shield and dielectric insulator may further reduce signal crosstalk interference, which may be essential when transferring noise sensitive signals, for example, in high speed communications systems.

Conductive core 221 and conductive shield 223 may be made of copper. In one embodiment, conductive core 221 may be coated with a silver material for transmitting high frequency signals. It should be appreciated that conductive core 221 may be a solid copper structure or, as in an alternative embodiment, strands of copper routing wires bundled to form a single conductive core 221. Dielectric insulator 222 may be formed using a polyethylene (PE) or polytetrafluoroethylene (PTFE) material.

The dielectric constant of dielectric insulator 222 and the radius of conductive core 221 and conductive shield 223 may determine the characteristic impedance (Z0) of coaxial routing wire 230. It should be appreciated that matching characteristic impedances between a signal source and coaxial routing wire 230 enable maximum signal transfer (i.e., low transmission loss) through coaxial routing wire 230. Generally, the Z0 of coaxial routing wire 230 may be 50 Ohms.

Conductive core 221 may be utilized for transferring signals. Conductive shield 223 prevents signals that are being transmitted in coaxial routing wire 230 from being interfered by other signals. Furthermore, conductive shield 230 may also prevent signals that are being transmitted in conductive core 221 from interfering with other circuits (not shown) outside of coaxial routing wire 230. Conductive shield 223 may be at a ground potential level. It should be appreciated that signals travelling through conductive core 221 may generate electric and magnetic flux that fringes from conductive core 221 into dielectric insulator 222. The fringing electrical flux may flow to ground when it touches conductive shield 223, therefore preventing any form of interference to other external signals.

FIG. 2D shows coaxial routing wires 230 embedded in their respective through-holes 220. In the embodiment of FIG. 2D, each through-hole 220 may have one embedded coaxial routing wire 230. Gaps 225 may be the empty area within through-holes 220 after the insertion of respective coaxial routing wires 230. In one embodiment, the length (L1) of coaxial routing wire 230 may be greater than the length (L2) of through-hole 220. It should be appreciated that the lengths of coaxial routing wires 230 and the respective lengths of through-holes 220 may be different because coaxial routing wires 230 may be a prefabricated component with a fixed length. Therefore, a polishing process may be performed after embedding coaxial routing wires 230 into the respective through-holes 220. The polishing process may trim coaxial routing wires 230 to be at the same level as the top and bottom surfaces of package substrate layer 210. In one embodiment, the trimming process may be a chemical mechanical polishing (CMP) process. Coaxial routing wires 230 may be inserted into the respective through-holes 220 automatically. In one embodiment, the automatic insertion process may include: (i) identifying all through-holes 220 on package substrate layer 210 and (ii) inserting coaxial routing wires 230 into the identified through-holes 220.

Figure 2E:
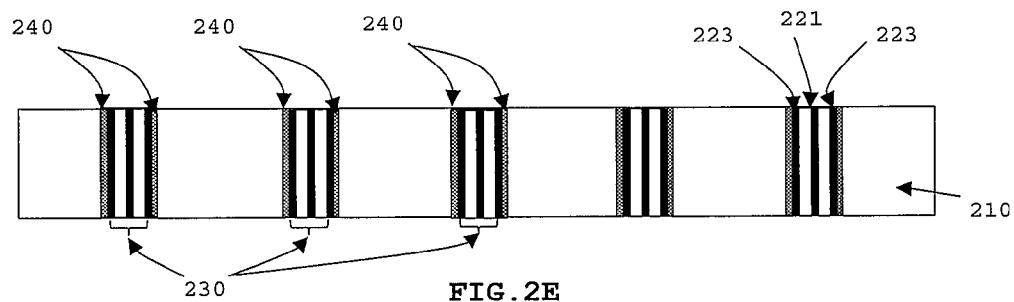

FIG. 2E shows gaps 225 of FIG. 2D for each through-hole 220 filled with dielectric material 240. In one embodiment, dielectric material 240 may include epoxy. Dielectric material 240 may be inserted for two reasons: (i) to separate conductive shield 223 in coaxial routing wire 230 from touching the walls of through-holes 220 and (ii) to hold the coaxial routing wires 230 in place in their respective through-holes 220. In one embodiment, filling dielectric material 240 into gaps 225 may also centralize coaxial routing wires 230 with their respective through-holes. In one embodiment, a process to fill dielectric material 240 into through-holes 220 may include: (i) applying a photoresist coating on the top surface of package substrate layer 210, (ii) performing a photolithography process with a photomask that includes a plurality of openings each opening of which may enable light to shine on gaps 225 on package substrate layer 210, and (iii) depositing the dielectric material 230 into gaps 225.

Figure 2F:
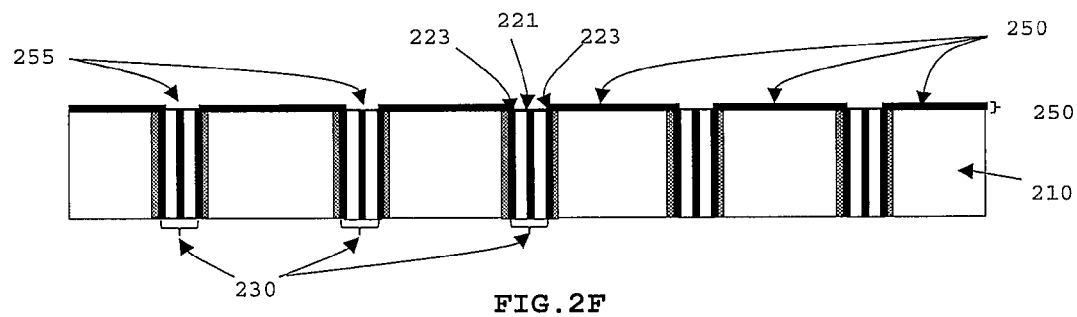

FIG. 2F shows conductive layer 250 disposed on the top surface of package substrate layer 210. In one embodiment, conductive layer 250 may be formed using the same material as conductive shield 223 or conductive core 221 (e.g., copper). In FIG. 2F, conductive layer 250 extends to cover a substantial portion of the top surface of package substrate layer 210, leaving gaps that coincide with the respective through-holes 220 in package substrate layer 210. Therefore, conductive layer 250 may include a plurality of holes 255 that are directly aligned with through-holes 220. In one embodiment, the diameter of each of holes 255 may be smaller than that of through-holes 220. Holes 255 may be smaller than through-holes 220 so that a portion of conductive layer 250 may overlap and be electrically coupled with conductive shields 223 in the respective coaxial routing wires 230.

Conductive layer 250 may be manufactured using a sequence of semiconductor processes. In one embodiment, the semiconductor processes to manufacture conductive layer 250 may include: (i) applying a photoresist solution on the top surface of package substrate layer 210, (ii) performing a photolithography process on a photomask with a plurality of openings to create holes 255 on conductive layer 250, (iii) removing the photoresist, except from areas where holes 255 are formed, (iv) depositing a conductive material over the top surface of package substrate 210 to form conductive layer 250 and, (v) removing the remaining portion of photoresist to form holes 255.

Figure 2G:
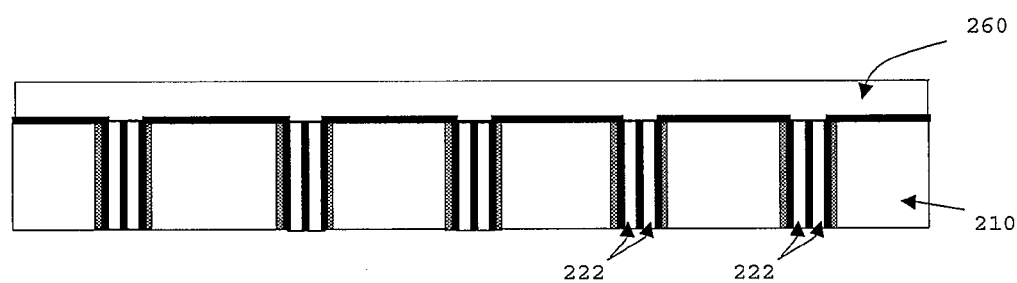

FIG. 2G shows dielectric layer 260 formed above conductive layer 250. In one embodiment, dielectric layer 260 may be formed using similar materials as package substrate layer 210 (e.g., ceramic). Alternatively, dielectric layer 260 may be formed using similar materials as used to form dielectric insulator 222. Dielectric layer 260 may be formed by placing a dielectric sheet above conductive layer 250 and fusing the dielectric sheet and conductive layer 250 together. The fusing may be achieved by heating the dielectric sheet and conductive layer 250 (as an example).

Figure 2H:
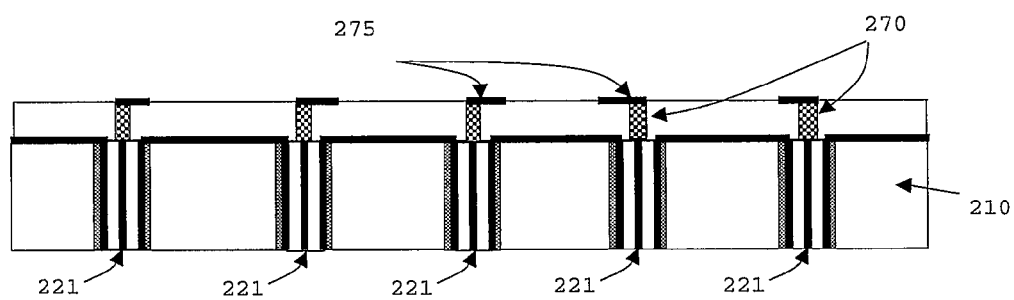

FIG. 2H shows conductive vias 270 formed within dielectric layer 260 and package traces 275 formed on top of dielectric layer 260. Conductive vias 270 and package traces 275 may be formed using similar materials as conductive core 221 (e.g., copper). In the embodiment of FIG. 2H, one end of each conductive via 270 is coupled to a corresponding conductive core 221 while another end is coupled to a corresponding package trace 275. In one embodiment, conductive vias 270 may be similar to PTH vias. Each conductive via 270 may penetrate through dielectric layer 260.

Conductive vias 270 and package traces 275 may be formed using semiconductor processes. In one embodiment, conductive vias 270 may be formed using a laser drilling process. It should be appreciated that the laser drilling process may be preferred compared to a mechanical drilling process because of the small width and depth of conductive vias 270.

It should be noted that package traces 275 may be formed using another semiconductor processes such as photolithography processes or deposition processes.

Figure 2I:
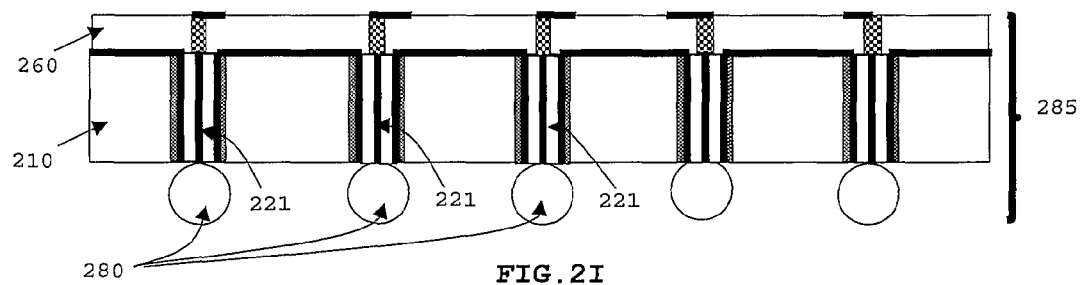

FIG. 2I shows solder balls 280 attached to the bottom surface of package substrate layer 210.

It should be appreciated that FIG. 2I is merely for illustrating where solder balls 280 may be coupled to its corresponding conductive core 221. The actual attachment of solder balls 280 on a bottom surface of package substrate layer 210 may further include forming solder pads (not shown).

Solder balls 280 may transfer I/O signals to and from package substrate layer 210. As shown in the embodiment of FIG. 2I, each solder ball 280 is attached in such manner as to couple with a corresponding conductive core 221 while not touching the surrounding conductive shield 223. In an alternative embodiment, solder balls 280 may be coupled to ground and not with conductive core 221. In one embodiment, package substrate 285 may be a detailed representation of package substrate 120 of FIG. 1.

Solder balls 280 may be formed by conventional semiconductor processes. In one embodiment, a conventional semiconductor process may include: (i) depositing a solder ball composition on a selected area at the bottom surface of package substrate layer 210, and (ii) subjecting package substrate layer 210 and the deposited solder ball composition to a high temperature to form a circular solder balls 280.

Figure 2J:
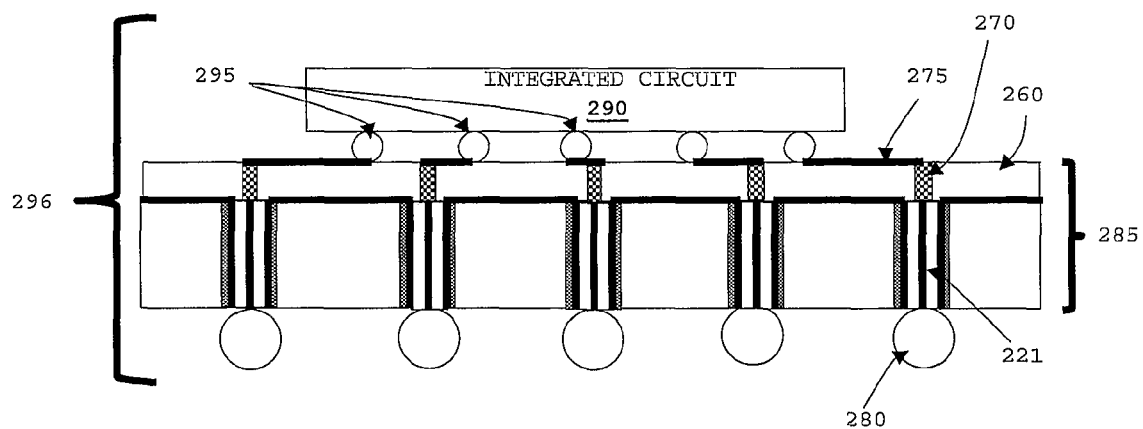

FIG. 2J shows integrated circuit 290 mounted on the top surface of dielectric layer 260. Integrated circuit 290 may be similar to integrated circuit 110 of FIG. 1. Integrated circuit 290 and package substrate 285 forms integrated circuit package 296. In one embodiment, integrated circuit package 296 may be a detailed representation of integrated circuit package 100 of FIG. 1.

Still referring to FIG. 2J, integrated circuit 290 may be coupled to dielectric layer 260 via interconnects 295. Each interconnect 295 may be coupled to its corresponding package trace 275. In one embodiment, one end of the package trace 275 may be a conductive pad where a respective interconnects 295 is coupled. The size of conductive pad may be similar to the size of interconnect 295.

Integrated circuit 295 may be coupled to package substrate 285 in two ways: (i) using flip-chip technology, or (ii) using wire-bond technology. In the embodiment of FIG. 2J, integrated circuit 290 is coupled to package substrate 285 using flip-chip technology.

A signal from integrated circuit 290 that is destined to reach an external circuit may be transmitted via one of interconnections 295, and its corresponding package trace 275, conductive via 270, conductive core 221 and solder ball 280. Similarly, a signal received from an external circuit that is destined to reach integrated circuit 290 may be transmitted via one of solder balls 280, its corresponding conductive core 221, conductive via 270, package trace 275 and interconnection 295.

Figure 3:
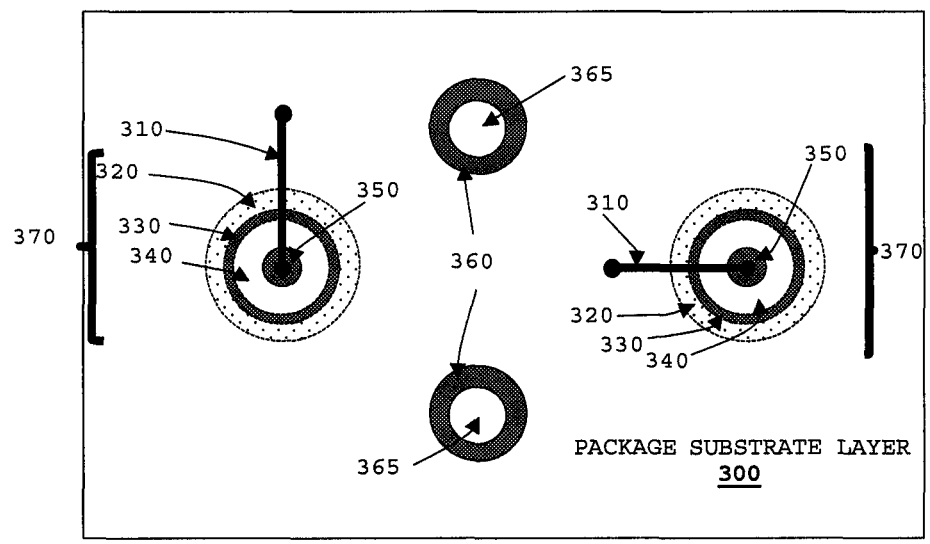
FIG. 3 shows a top view of an illustrative package substrate in accordance with one embodiment of the present invention.

FIG. 3, meant to be illustrative and not limiting, shows a top view of a package substrate in accordance with one embodiment of the present invention. Package substrate layer 300 may include two coaxial routing wires 370 and two ground vias 360. Coaxial routing wires 370 may be similar to the top view of routing segment 230 as shown in the right image of FIG. 2C. In the embodiment of FIG. 3, each coaxial routing wire 370 includes package trace 310, conductive core 350, dielectric insulator 340, conductive shield 330 and dielectric material 320, which may be similar, respectively, to package trace 275, conductive core 221, dielectric insulator 222, conductive shield 223 and dielectric material 240 of FIGS. 2A-2J. As such, for the sake of brevity, elements that have been described before will not be described in detail again. One end of package trace 310 may be coupled to conductive core 350. A signal may flow between package trace 310 and conductive core 350. Electrical fluxes may fringe from conductive core 350 to conductive shield 330 when signals are being transmitted through conductive core 350. This may cause signal crosstalk and affect other signals that are being transmitted through another coaxial wire 370.

In one embodiment, ground vias 360 may be PTH vias. Middle portion 365 of the PTH vias may include dielectric materials (e.g., epoxy). Ground vias 360 may serve to reduce the signal interference crosstalk between two signals transmitting through two different coaxial routing wires 370. In the embodiment of FIG. 3, the two ground vias 360 may be coupled to each other via a conductive layer (e.g., conductive layer 255 of FIG. 2F).

Figure 4:
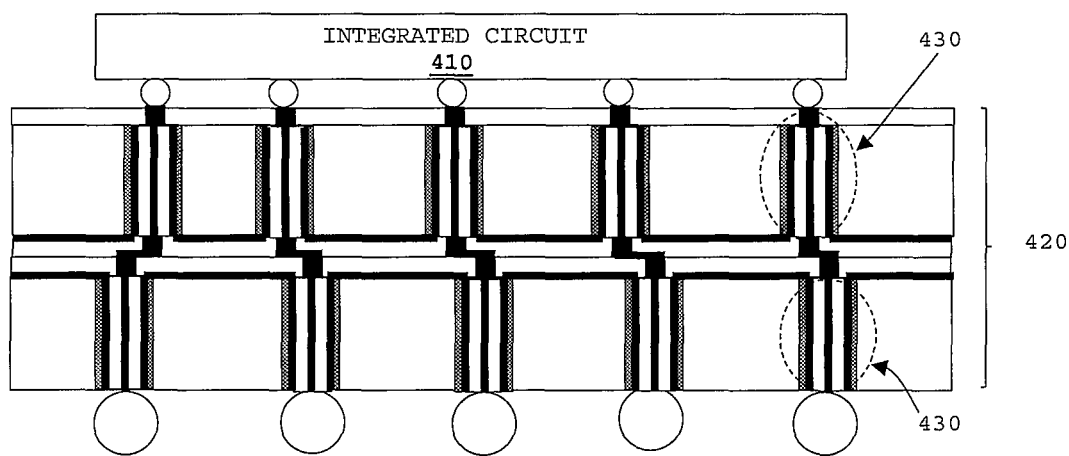
FIG. 4 shows an illustrative integrated circuit package with a package substrate having two package substrate layers filled with coaxial routing wires in accordance with one embodiment of the present invention.

FIG. 4, meant to be illustrative and not limiting, shows an integrated circuit package with a package substrate having two package substrate layers with embedded coaxial routing wires in accordance with one embodiment of the present invention. Integrated circuit 410 may be mounted on a top surface of package substrate 420. Integrated circuit 410 may be similar to integrated circuit 290 of FIG. 2J or integrated circuit 110 of FIG. 1. In one embodiment, multiple package substrate layers may be required to support complex signal routing requirements in integrated circuit 410. Coaxial routing wires 430 within package substrate 420 may be similar to coaxial routing wires 230 of FIG. 2C. In total, package substrate 420 has two layers that have coaxial routing wires 430.

Figure 5:
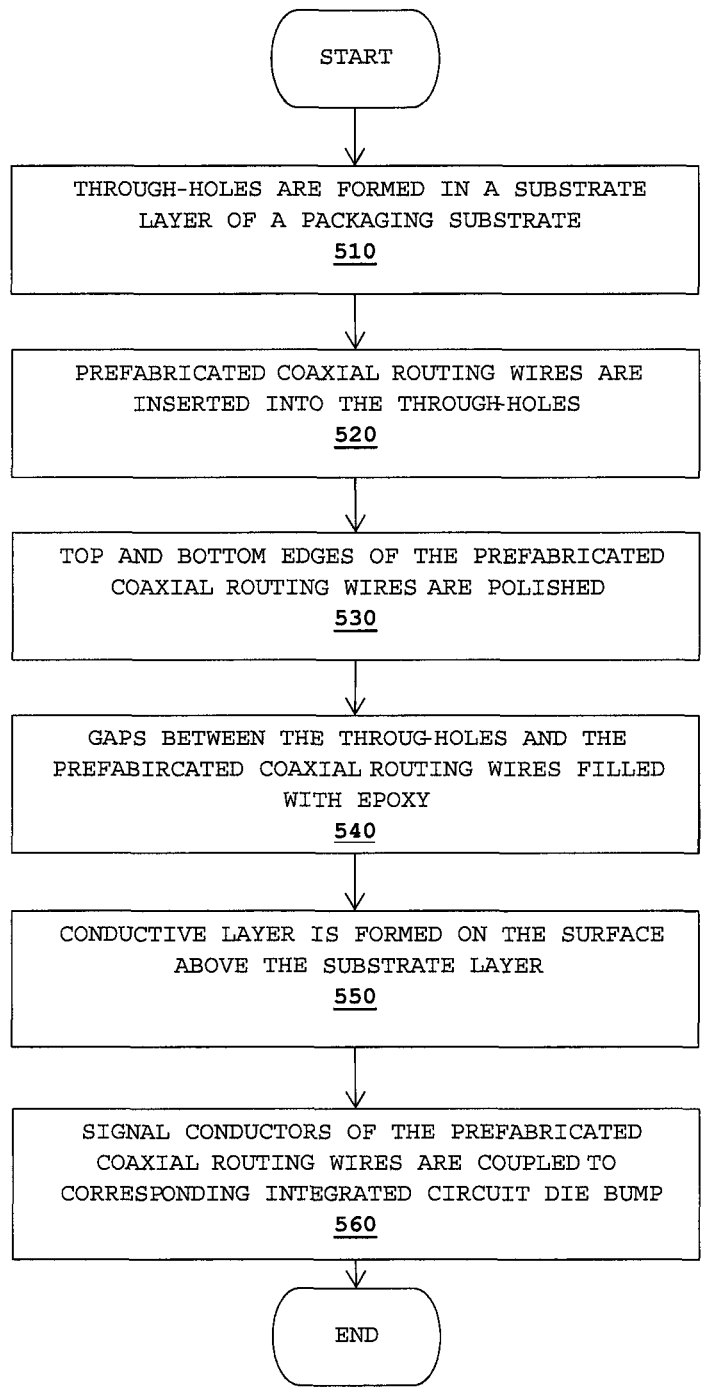
FIGS. 5 and 6 show illustrative methods of manufacturing an integrated circuit package in accordance with some embodiments of the present invention.

FIG. 5, meant to be illustrative and not limiting, is a flowchart of illustrative steps for manufacturing an integrated circuit package in accordance with one embodiment of the present invention. The integrated circuit package may be similar to integrated circuit package 100 of FIG. 1.

At step 510, through-holes are formed in a substrate layer of a packaging substrate. The through-holes may be similar to through-holes 220 of FIG. 2B and the substrate layer may be similar to package substrate layer 210 of FIG. 2B. At step 520, prefabricated coaxial routing wires are inserted into the through-holes. The prefabricated coaxial routing wires may be similar to coaxial routing wires 230 of FIG. 2C. After the completion of step 520, the resulting package substrate layer may be similar to the structure shown in FIG. 2D. At step 530, the top and bottom surfaces of the prefabricated coaxial routing wires are polished so that the prefabricated coaxial routing wires may be of the same height (or length) as the height of the package substrate layer. It should be appreciated that a prefabricated coaxial routing wire may have a pre-defined length. In one embodiment, the polishing process may be a chemical mechanical polishing (CMP) process.

At step 540, gaps between the through-holes and the prefabricated coaxial routing wires are filled with epoxy. In one embodiment, the gaps may be similar to gaps 225 of FIG. 2D. The epoxy may be similar to dielectric material 240 of FIG. 2E. Therefore, after the completion of step 540, the resulting package substrate layer may be similar to package substrate layer 210 of FIG. 2E. In one embodiment, the epoxy may be filled using a deposition process. At step 550, a conductive layer may be formed on a surface of the substrate layer. The conductive layer may include holes that are located directly above the prefabricated coaxial routing wires. The holes may be similar to holes 255 of FIG. 2F and the conductive layer may be similar conductive layer 250 of FIG. 2F. After the completion of step 550, the resulting package substrate layer may be similar to package substrate layer 210 of FIG. 2F.

At step 560, signal conductors of the prefabricated coaxial routing wires are coupled to their respective integrated circuit die bumps. The signal conductors may be similar to conductive cores 221 of FIG. 2C. The integrated circuit may be similar to integrated circuit 290 of FIG. 2J while the bumps may be similar to interconnections 295 of FIG. 2J. In one embodiment, the signal pathway from a conductive core to its corresponding circuit die bump may be similar to a signal pathway that includes conductive vias 270 and package traces 275 as shown in FIG. 2H. At the completion of step 560, an integrated circuit package similar to integrated circuit package 296 of FIG. 2J may be formed.

Figure 6:
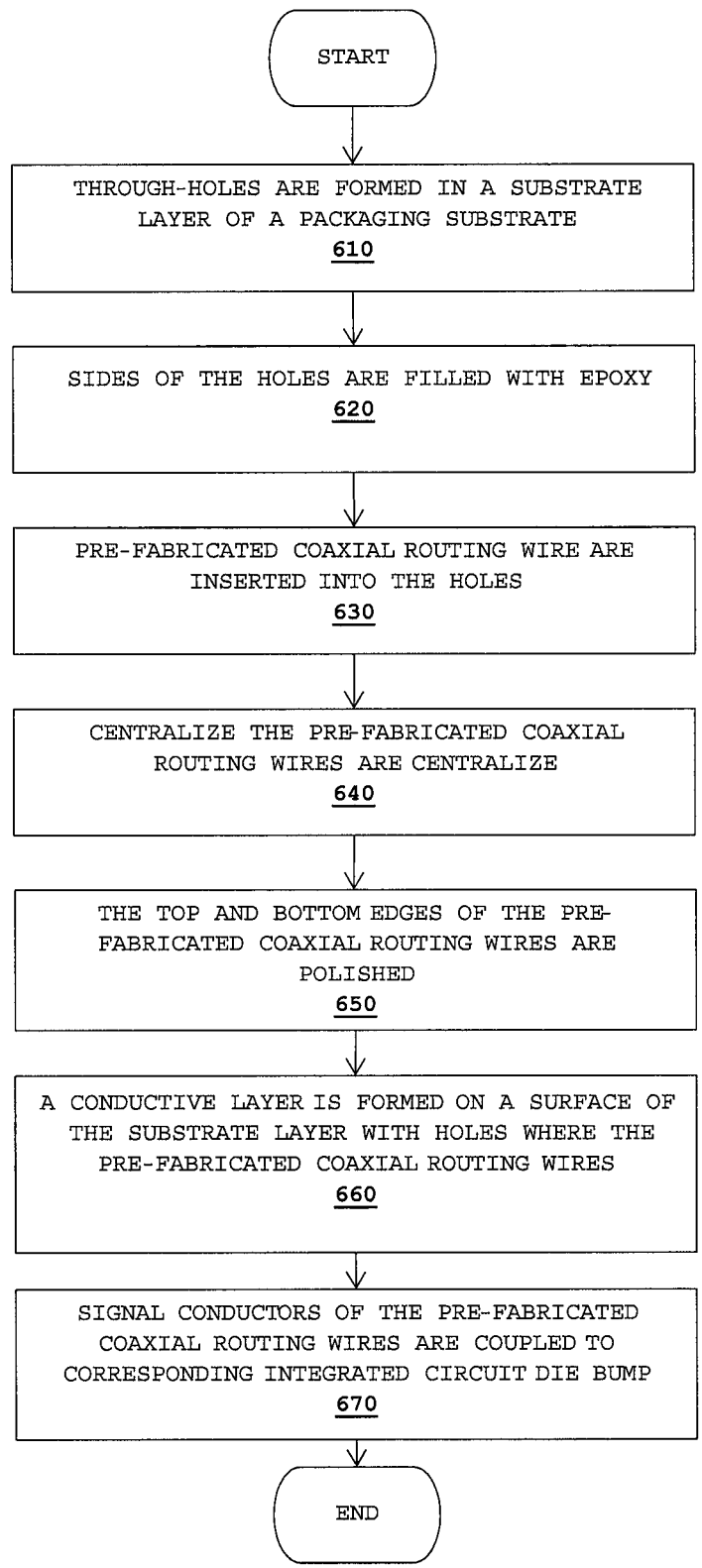

FIG. 6, meant to be illustrative and not limiting, shows another method of forming an integrated circuit package in accordance with one embodiment of the present invention. It should be noted that the method shown in FIG. 6 shares similarities with that shown in FIG. 5. For example, steps 610, 630, 650, 660 and 670 are similar to the respective steps 510, 520, 530, 550 and 560 of FIG. 5. As such, for the sake of brevity, these steps will not be repeated. The method shown in FIG. 6 includes additional steps 620 and 640. After the formation of the through-holes at step 610, sides of the respective through-holes are filled with an epoxy material at step 620. After the insertion of the pre-fabricated coaxial routing wires at step 630, the wires are centralized at step 640. It should be appreciated that the centralizing of the pre-fabricated coaxial routing wires may increase their reliability.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A method of manufacturing an integrated circuit package substrate, comprising:
   forming a hole through a substrate layer in the package substrate, wherein the substrate layer has a surface;
   inserting a prefabricated coaxial wire segment into the hole;
   after inserting the prefabricated coaxial wire segment into the hole, forming a dielectric layer above the substrate layer over the inserted prefabricated coaxial wire segment;
   polishing the prefabricated coaxial wire segment to prevent the prefabricated coaxial wire segment from protruding from the surface of the substrate layer;
   forming a conductive via through the dielectric layer; and
   after forming the conductive via, forming conductive traces on the dielectric layer.

2. The method as defined in claim 1, wherein the prefabricated coaxial wire segment comprises:
   a signal conductor;
   a ground conductor that surrounds the signal conductor; and
   dielectric material interposed between the signal conductor and the ground conductor.

3. The method as defined in claim 1, wherein the prefabricated coaxial wire segment is a discrete component that is fabricated separately from the substrate layer.

4. The method as defined in claim 1, wherein the prefabricated coaxial wire segment has a diameter that is smaller than that of the hole.

5. The method as defined in claim 1, further comprising:
   forming additional dielectric material that is interposed between an inner wall of the hole and the prefabricated coaxial wire segment.

6. The method as defined in claim 1, further comprising:
   forming another hole through the substrate at adjacent to the hole; and
   inserting another prefabricated coaxial wire segment into the another hole.

7. The method as defined in claim 1, wherein the conductive traces are configured to make electrical contact with an integrated circuit die that is mounted on top of the integrated circuit package substrate.

8. The method as defined in claim 1, further comprising:
   forming a conductive layer above the substrate layer; and
   removing a portion of the conductive layer that overlaps with the hole.

9. A method of manufacturing an integrated circuit package substrate, comprising:
   drilling a hole from one surface of the package substrate to another surface of the package substrate;
   lining the entire inner surface of the hole with epoxy;

placing a prefabricated coaxial wire segment into the hole; and adjusting the prefabricated coaxial wire segment to center the prefabricated coaxial wire within the hole, wherein the top and bottom surfaces of the prefabricated coaxial wire segment are flush with the one surface and the another surface of the package substrate.

10. The method defined in claim 9, wherein the dielectric material comprises insulating material.

11. The method defined in claim 9, wherein the prefabricated coaxial wire comprises:
a signal conductor;
a ground conductor that surrounds the signal conductor; and
a dielectric layer that is interposed between the signal conductor and the ground conductor.

12. The method defined in claim 9, wherein drilling the hole comprises a selected one of mechanical drilling and laser drilling.

13. The method defined in claim 9, wherein the package substrate is formed using material selected from one of: organic substrate material and ceramic substrate material.

14. A method of forming an integrated circuit package, comprising:
drilling a package substrate to form a hole in the package substrate;
inserting a prefabricated coaxial routing structure into the hole such that gaps are formed between the prefabricated coaxial routing structure and the inner surface of the hole;
while the prefabricated coaxial routing structure is inserted in the hole, filling the gaps between the prefabricated coaxial routing structure and the inner surface of the hole with dielectric material; and
forming a conductive grounding layer on a first surface of the package substrate, wherein the conductive grounding layer is coupled to a shielding layer in the prefabricated coaxial routing structure.

15. The method defined in claim 14, wherein filling the gaps between the prefabricated coaxial routing structure and the inner surface of the hole with dielectric material comprises filling the gaps with epoxy.

16. The method defined in claim 14, further comprising:
forming a solder ball at a second surface of the package substrate that opposes the first surface, wherein the solder ball is coupled to a core signal conductor in the prefabricated coaxial routing structure.

17. The method defined in claim 16, further comprising:
forming a dielectric layer on the first surface of the package substrate; and
forming a via in the dielectric layer that is coupled to the core signal conductor in the prefabricated coaxial routing structure.

18. The method defined in claim 17, further comprising:
mounting another package substrate on the dielectric layer.

19. A method of manufacturing an integrated circuit package substrate, comprising:
drilling a hole from one surface of the package substrate to another surface of the package substrate;
lining the entire inner surface of the hole with dielectric material;
placing a prefabricated coaxial wire segment into the hole after lining the entire inner surface of the hole with the dielectric material; and
adjusting the prefabricated coaxial wire segment to center the prefabricated coaxial wire within the hole, wherein the top and bottom surfaces of the prefabricated coaxial wire segment are flush with the one surface and the another surface of the package substrate.

* * * * *